United States Patent [19]
LeFevre

[11] Patent Number: 5,801,556
[45] Date of Patent: Sep. 1, 1998

[54] LOW VOLTAGE CMOS FPA INTERFACE

[75] Inventor: David LeFevre, Redondo Beach, Calif.

[73] Assignee: Hughes Electronics, El Segundo, Calif.

[21] Appl. No.: 798,261

[22] Filed: Feb. 11, 1997

[51] Int. Cl.[6] .................................................. H02M 11/00
[52] U.S. Cl. .......................... 327/103; 327/53; 327/65; 327/66
[58] Field of Search ................................ 327/51, 52, 53, 327/65, 66, 103

[56] References Cited

U.S. PATENT DOCUMENTS

| | | | |
|---|---|---|---|
| 4,806,761 | 2/1989 | Carson et al. | 250/332 |
| 4,887,047 | 12/1989 | Somerville | 330/257 |
| 5,552,760 | 9/1996 | Deguchi | 327/103 |
| 5,578,949 | 11/1996 | McMorrow, Jr. | 327/103 |

Primary Examiner—David C. Nelms
Assistant Examiner—Hoai Ho
Attorney, Agent, or Firm—Leonard A. Alkov; William C. Schubert; Glenn H. Lenzen, Jr.

[57] ABSTRACT

A circuit for interfacing between the output voltage terminals of a focal plane array (FPA) detector and subsequent digital processing circuitry and employing a differential circuit including respective resistors to create first and second input currents and a control circuit to adjust the first and second input currents to eliminate the common mode current component. The control circuit includes a current source and a current mirror amplifier on each side of the differential circuit with each current mirror amplifier supplying a current sample signal to a current sense amplifier which, in turn, supplies a control signal to each of the current sources. The interface circuit accommodates input voltages of different polarities and magnitudes, while operating from reduced supply voltage levels and providing output currents limited within a defined range.

17 Claims, 3 Drawing Sheets

LOW VOLTAGE CMOS FPA INTERFACE

BACKGROUND OF THE INVENTION

1. Field of the Invention

The subject invention relates to forward looking infrared (FLIR) night sights and, more particularly, to improved focal plane array (FPA) interface circuitry for such night sights.

2. Description of Related Art

FLIR night sights typically employ a detector known as a focal plane array, typically cryogenically cooled to 77° Kelvin. The detector output voltage is supplied through interface or buffer circuitry to subsequent signal processing circuitry, typically including sample/hold and analog-to-digital conversion circuitry.

Because of differences in detector material, some IR FPAs are powered with positive supplies and some with negative supplies, typically either 0 to −5 volts or 0 to +5 volts. A different FPA interface circuit has been required for each of these types of FPAs according to the prior art.

Prior art approaches to FPA interface circuitry have included switch capacitor circuitry and off-the-shelf component designs. Switch capacitor designs require that device power supplies include the input voltage swing. A 10-volt input swing would require 2–3 u CMOS process. The newer 1.2–0.8 u (and smaller) CMOS processes have lower breakdown voltages and require power supplies limited to 5 to 3.3 VDC, with 3.3-VDC being a new standard supply voltage for CMOS ICs. Designs using off-the-shelf components can handle large voltage swings but they use more board space and consume more power. Thus, there is a need for a more compact, versatile FPA circuit adapted for use with, and fabricated according to, newer CMOS processes.

OBJECTS AND SUMMARY OF THE INVENTION

It is therefore an object of the invention to improve FLIR systems;

It is another object of the invention to improve FPA interface circuitry;

It is another object of the invention to provide an FPA interface circuit useful with both positive and negative power supplies; and It is another object of the invention to provide such an FPA interface circuit fabricatable according to new CMOS processes.

These and other objects are achieved according to the invention by providing circuitry which converts the detector output voltage signal to a current and subtracts out the common mode (quiescent) current component. Subsequent processing circuitry therefore need only handle signal current and not large variations in quiescent current.

In the preferred embodiment a differential circuit is employed wherein first and second input voltages are converted to first and second input currents and wherein first and second current sources under the control of a current sense amplifier are employed to eliminate the common mode current component, resulting in generation of first and second output current signals lying within a defined current range. The current sense amplifier and the first and second current sources function to keep constant the sum of first and second pass currents in the respective sides of the differential circuit.

Circuitry according to the invention interfaces to FPAs with a wide range of output voltages, yet can be fabricated with modern low-voltage CMOS technologies, thus optimizing circuit size and power. The ability to build such interface circuitry with mainstream digital processes makes it possible to integrate, on one IC, all the functions of the FPA interface and digital signal processing. The invention further provides continuous time analog CMOS circuitry capable of interfacing with infrared FPA outputs having a DC common mode range of +4 VDC to −4 VDC.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings.

DETAILED DESCRIPTION OF THE PREFERRED EMBODIMENTS

The following description is provided to enable any person skilled in the art to make and use the invention and sets forth the best modes contemplated by the inventor of carrying out his invention. Various modifications, however, will remain readily apparent to those skilled in the art, since the general principles of the present invention have been defined herein specifically to provide an FPA interface circuit of compact, readily-producible design implementable on a single chip according to newer CMOS principles.

Figure 1:
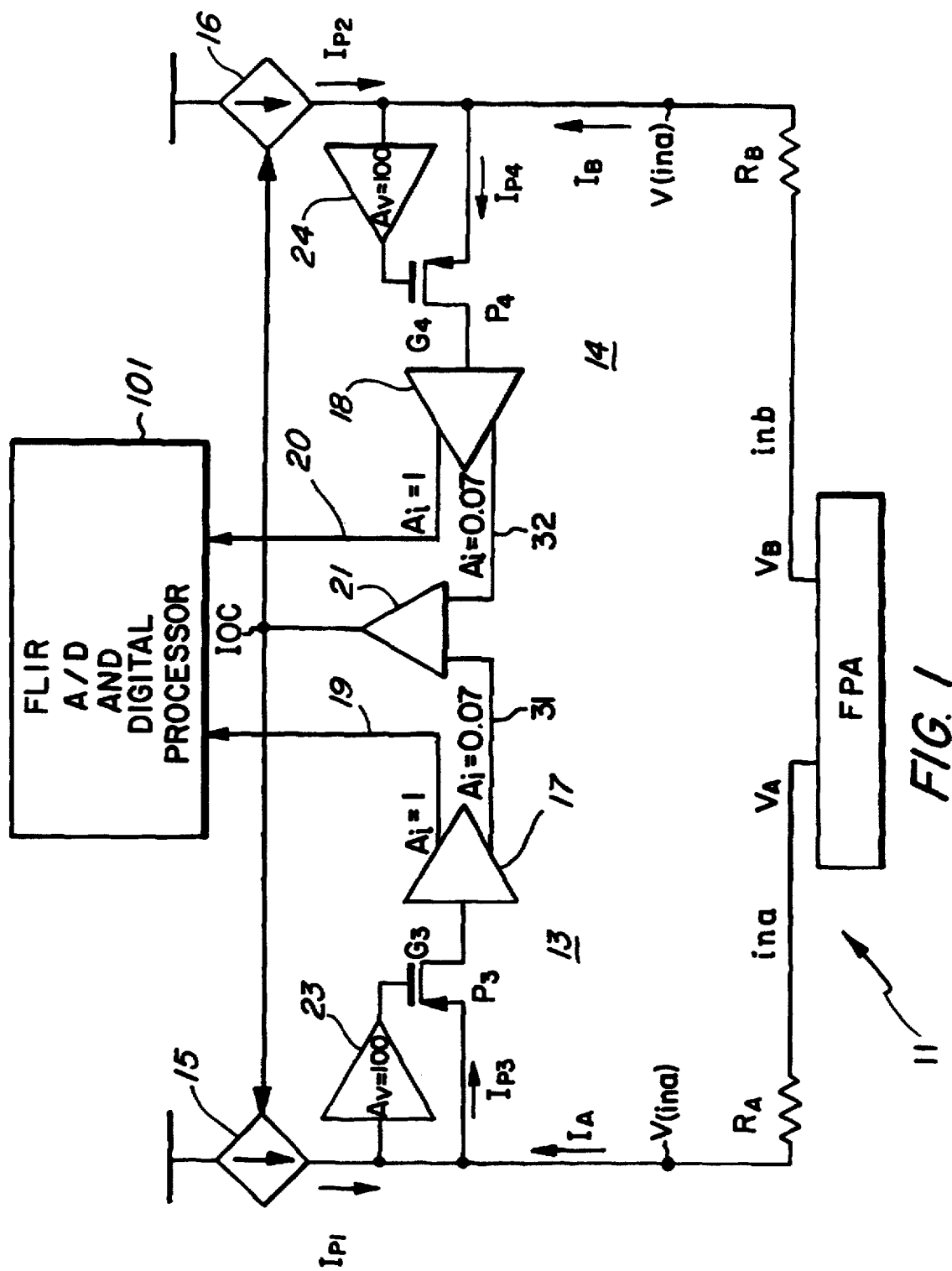
FIG. 1 is a circuit block diagram illustrating the preferred embodiment of the invention.

FIG. 1 shows a block diagram of the preferred FPA interface circuit 11, which receives an output voltage from a focal plan array detector (FPA). The input voltage range is +5 to −5 volts DC, −1 to +1 volt single-ended (−2 to +2 volt differential). The circuit 11 is differential, with a first circuit half 13 being the mirror image of a second circuit half 14. A first input to the first circuit half 11 is provided at input $V_A$ through a first resistor RA to the input of a first amplifier 23 and to the source of a first pass transistor P3. The input of the first amplifier 23 is also connected to the output of a first current source 15. The output of the first amplifier 23 is connected to the gate $G_3$ of the first pass transistor P3. The output of the first pass transistor P3 is supplied to a first current mirror buffer amplifier 17. The first current mirror buffer amplifier 17 provides a first signal current output on a signal path 19 and a first sample current output on a signal path 31 to the first input of a current sense amplifier 21.

The second circuit half 14 of the differential circuit 11 has an input $V_B$ connected through a second resistor RB to the source of a second pass transistor P4 and to the input of a second amplifier 24. The input of the second amplifier 24 is also connected to the output of a second current source 16, while the output of the second amplifier 24 controls the gate $G_4$ of the second pass transistor P4. The drain of the second pass transistor P4 is connected to the input of a second current mirror buffer amplifier 18, which provides a second signal current output on signal path 20 and a second sample current output on a signal path 32 to a second input of the current sense amplifier 21. The output of the current sense amplifier 21 at a node IOC is supplied as a control signal to the respective current sources 15, 16.

Since the preferred embodiment is differential, a discussion of the operation of one circuit half 13 is also illustrative of the operation of the second half 14. In operation, with respect to circuit half 13, the 10 k resistor RA converts the input voltage $V_A$ to a current $I_A$. The first current source 15 subtracts out common mode current for the input current $I_A$, and the remaining signal current flows through the first pass transistor P3. The first current mirror buffer amplifier 17 supplies signal current to the subsequent FLIR signal processing circuitry 101 over the signal path 19.

With respect to circuit half 14, the second current source 16 similarly subtracts out common mode current from the input current $I_B$ and the remaining current flows through the second pass transistor P4. The second current mirror buffer amplifier 18 supplies signal current to the signal processing circuitry 101 over the signal path 20. Such processing circuitry 101 preferably includes current mode sample and hold circuits to receive the signal currents on signal paths 19, 20.

The current sense amplifier 21 receives the sample current output of the first current mirror amplifier 17 on signal line 31 and sums it with the counterpart current on signal line 32 from the second half 14 of the differential circuit 11. The output of the current sense amplifier 21 controls the first and second current sources 15, 16. With respect to the circuit half 13, the first amplifier 23 controls the gate voltage of the pass transistor P3 to lower the input impedance seen by the 10 k resistor RA, and has minimal effect on the first loop formed by the current mirror buffer amplifier 17, the current sense amplifier 21, and the current source 15. With respect to circuit half 14, the second amplifier 24 controls the gate voltage of the pass transistor P4 in the same manner with minimal effect on the second loop formed by amplifier 18, amplifier 21, and the current source 16. The overall function of the first and second loops is to keep the sum of the pass currents $I_{P3}$ and $I_{P4}$ constant.

Figure 2:
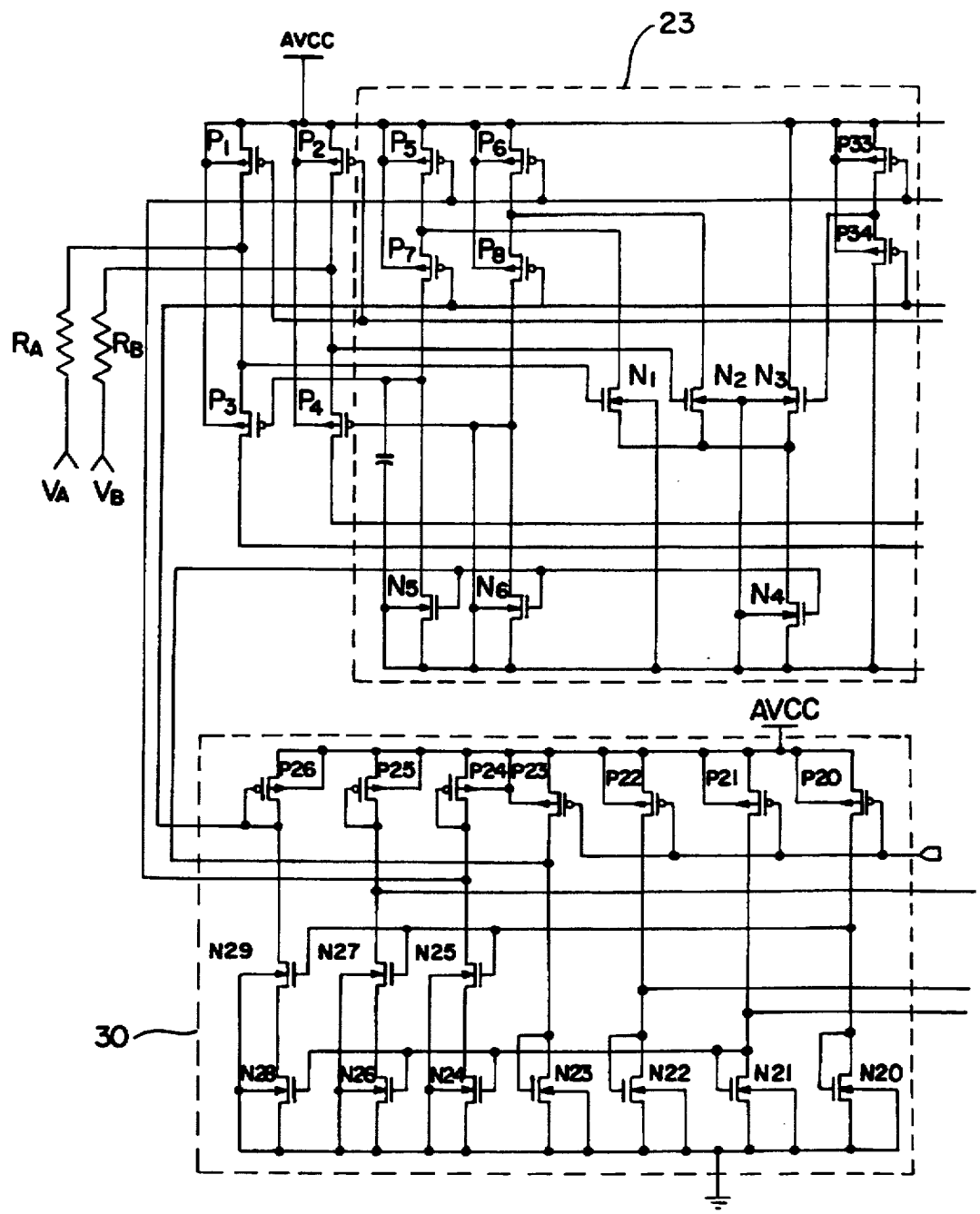
FIGS. 2 and 3 comprise a transistor level circuit schematic of the preferred embodiment.
Figure 3:
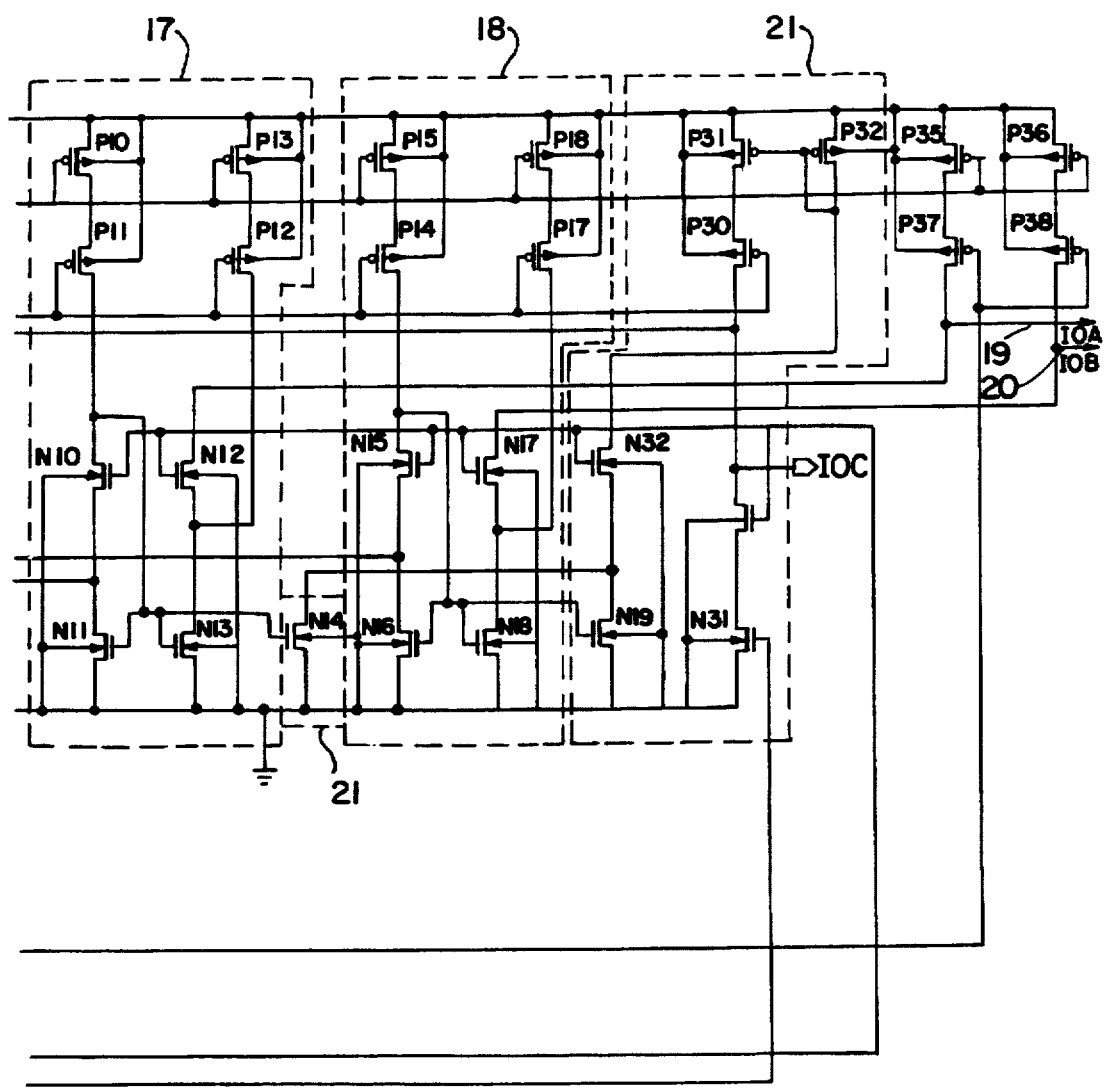

The schematic of FIGS. 2 and 3 shows the detail of circuit implementation wherein all transistors may be fabricated according to 1.2–0.8 micron or smaller CMOS processes. The transistors P20–P26 and N20–N29 of FIG. 2 comprise auxiliary circuitry 30, which generates bias voltages for the circuit. Transistors P1, P2 form the common mode current sources 15, 16, which provide the current for the pass transistors P3, P4, and the resistors RA and RB.

A differential folded cascode amplifier 23-24 provides the functions of the first and second amplifiers 23, 24. The amplifier 23-24 comprises N MOSFETS N1, N2, N3, N4, N5, N6, and P MOSFETS P5, P6, P7, P8. The amplifier 23 controls the gate voltages of the pass transistors P3 and P4 to force V(ina) and V(inb) to a fixed voltage (at P3 drain), which lowers the impedance at ina and inb.

The resistors RA and RB convert the input voltages VA and VB to currents. Since V(ina) is fixed (~2.5 VDC) and the common mode range of VA and VB is large (−4 to +4 VDC), the range of resistor currents I(RA) varies from +150 uA to −650 uA. To limit internal voltage swings, the common mode current through the pass transistors P3, P4 is set to 200 uA with a signal swing of ±100 uA. That is, $I_{P3}$=100 uA to 300 uA, and $I_{P4}$=300 uA to 100 uA. Consequently, the currents supplied by the common mode current sources P1, P2 range from 50 uA to 850 uA. The control of the currents $I_{P1}$ and $I_{P2}$ is discussed later.

The output of the pass transistor P3 drives the current mirror amplifier 17, shown in FIG. 3, which comprises four N MOSFETS N10, N11, N12, N13. Because of the low supply voltage, the current mirror circuit 17 is wired differently from normal. The standard technique is to connect the transistor N10 and the transistor N11 as MOS diodes with their gates tied to their drains. Generating the cascode gate bias for the transistor N10 with the transistor N22 allows connecting the gate of the transistor N11 to the drain of the transistor N10. Consequently, the transistors N11 and N13 have lower drain-to-source voltages than gate-to-source voltages, which saves voltage headroom for other parts of the circuit. A current source formed by the transistors P10, P11 provides quiescent current for the transistor N10, while a current source formed by the transistors P13, P12 removes the added current so as to allow the transistor N12 to pass only signal current.

Transistors N15, N16, N17, N18, P14, P15, P17, P18 form the current mirror amplifier 18 (FIG. 3). This amplifier mirrors the P4 current $I_{P4}$ in the same manner as the transistors N10–N14 and P10–P13 mirror the P3 current $I_{P3}$.

The current control amplifier 21 is made up of the transistors N14, N19, N30, N31, N32, P30, P31, P32 (FIG. 3). The current sense function is performed by the transistors N14 and N19, which mirror the transistors N11 and N16 with a current gain of ⅟15. The currents are summed by the transistor N32 and mirrored by the transistors P32 and P31. The transistors N30 and N31 comprise a fixed current source which is subtracted from the current mirror formed by transistors P30–32 at node IOC. IOC is a high impedance node connected to the gates of the common mode current source transistors P1 and P2, which closes the feedback loop to maintain $I_{P3}$ +$I_{P4}$ =400 uA. The transistors P35–P38 are fixed current sources which shift the output current range from {100 uA to 300 uA} to {−100 uA}.

Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. An interface circuit for connection to an input voltage comprising:

first and second input terminals for receiving said input voltage;

means for converting the voltage at said first terminal and the voltage at said second terminal to first and second input currents, respectively; and means for subtracting a common mode current component from each of said first and second input currents to produce first and second output current signals, said means for subtracting including a first current source means for providing a first output current for combination with said first input current to produce a third current and a second current source means for providing a second output current for combination with said second input current to produce a fourth current, said means for subtracting further including current mirror amplifier means receiving said third and fourth currents for producing said first and second output current signals and for producing first and second sample currents, said means for subtracting further including means for generating a current control signal from said first and second sample currents and supplying said current control signal to each of said first and second current source means.

2. The interface circuit of claim 1 wherein said means for subtracting further functions to maintain the sum of said third and fourth currents constant.

3. The interface circuit of claim 2 wherein said means for converting comprises first and second resistors connected to said amplifier means and further including means for lowering the input impedance seen by said first and second resistors.

4. The interface circuit of claim 3 wherein said means for lowering comprises:
   a first pass transistor connected between said first resistor and said current mirror amplifier means;
   a second pass transistor connected between said second resistor and said current mirror amplifier means;
   a first amplifier means supplied with said first output current for controlling said first transistor; and
   a second amplifier means supplied with said second output current for controlling said second transistor.

5. The interface circuit of claim 4 wherein said first and second pass transistors each comprise respective first and second field effect transistors, each having a gate, and wherein said first and second amplifier means are respectively arranged to control the respective gates of said first and second field effect transistors.

6. The interface circuit of claim 5 wherein each of said first and second current sources comprises a field effect transistor.

7. In a forward looking infrared night vision system, the circuitry comprising:
   a detector providing an output voltage;
   interface circuit means connected to receive said output voltage for converting said output voltage to an output signal comprising first and second output current signals and for eliminating common mode current from said output signal said interface circuit means comprising:
      means for converting said output voltage to first and second input currents;
      means for subtracting a common mode current component from each of said first and second input currents to produce first and second output currents, said means for subtracting including a first current source means for providing a first output source current for combination with said first input current and a second current source means for providing a second output source current for combination with said second input current;
      current mirror amplifier means receiving said first and second output currents for producing said first and second output current signals and for producing first and second sample currents; and
      means for generating a current control signal from said first and second sample currents and supplying said current control signal to each of said first and second current source means.

8. The circuitry of claim 7 wherein said detector comprises a focal plane array.

9. The circuitry of claim 7 wherein said interface circuit means comprises:
   means for converting said output voltage to first and second currents; and
   means for subtracting a common mode current component from each of said first and second currents to produce first and second output current signals.

10. The circuitry of claim 9 wherein said means for subtracting comprises:
    a first current source means for providing a first output current for combination with said first current to produce a third current; and
    a second current source means for providing a second output current for combination with said second current to produce a fourth current.

11. The circuitry of claim 10 further including:
    current mirror amplifier means for producing said first and second output currents and first and second sample currents; and
    means for generating a current control signal from said first and second output currents and supplying said current control signal to each of said first and second current source means.

12. The circuitry of claim 7 wherein said means for subtracting further functions to maintain the sum of said first and second output currents constant.

13. The circuitry of claim 12 wherein said means for converting comprises first and second resistors connected to said amplifier means and further including means for lowering the input impedance seen by said first and second resistors.

14. The circuitry of claim 13 wherein said means for lowering comprises:
    a first pass transistor connected between said first resistor and said current mirror amplifier means;
    a second pass transistor connected between said second resistor and said current mirror amplifier means;
    a first amplifier means supplied with said first output current for controlling said first transistor; and
    a second amplifier means supplied with said second output current for controlling said second transistor.

15. The circuitry of claim 14 wherein said first and second pass transistors each comprise respective first and second field effect transistors, each having a gate, and wherein said first and second amplifier means are arranged to control the respective gates of said first and second field effect transistors.

16. The circuitry of claim 15 wherein each of said first and second current sources comprises a field effect transistor.

17. An interface circuit for receiving the voltage output of a focal plane array detector and supplying a signal output to subsequent signal processing circuitry and comprising:
    a first field effect transistor having a gate, a drain, and a source;
    a first resistor connected to the drain of said first field effect transistor;
    a first current source having a control signal input and an output connected to the drain of said first field effect transistor and to the input of a means for applying a control signal to the gate of said first field effect transistor;
    the source of said first field effect transistor being connected to an input of a first current mirror amplifier having a first current signal output and a first sample current output;
    a second field effect transistor having a gate, a drain, and a source;
    a second resistor connected to the drain of the second field effect transistor;
    a second current source having a control signal input and an output connected to the drain of said second field effect transistor and to the input of a means for applying a control signal to the gate of said second field effect transistor;
    the source of said second field effect transistor being connected to an input of a second current mirror amplifier having a second current signal output and a second sample current output; and
    a current sense amplifier means receiving said first and second sample currents and providing a common control signal to the respective control signal inputs of said first and second current sources.

* * * * *